US009696752B2

(12) United States Patent
Stryker

(10) Patent No.: US 9,696,752 B2
(45) Date of Patent: Jul. 4, 2017

(54) DYNAMICALLY STABILIZED MAGNETIC ARRAY

(71) Applicant: Apple Inc., Cupertino, CA (US)

(72) Inventor: James A. Stryker, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 76 days.

(21) Appl. No.: 14/671,931

(22) Filed: Mar. 27, 2015

(65) Prior Publication Data

US 2016/0284497 A1    Sep. 29, 2016

(51) Int. Cl.
| | | |
|---|---|---|
| *H01H 9/00* | (2006.01) | |
| *G06F 1/16* | (2006.01) | |
| *H01F 7/02* | (2006.01) | |
| *H03K 17/97* | (2006.01) | |
| *H01F 7/04* | (2006.01) | |
| *H02N 15/00* | (2006.01) | |
| *B23Q 3/154* | (2006.01) | |
| *H01F 7/06* | (2006.01) | |
| *H03K 17/95* | (2006.01) | |

(52) U.S. Cl.
CPC ............. *G06F 1/16* (2013.01); *H01F 7/0252* (2013.01); *H03K 17/97* (2013.01); *B23Q 3/1543* (2013.01); *G06F 1/1675* (2013.01); *H01F 7/04* (2013.01); *H01F 7/06* (2013.01); *H02N 15/00* (2013.01); *H03K 17/95* (2013.01); *H03K 2217/96062* (2013.01)

(58) Field of Classification Search
USPC ........................................ 361/139, 144, 160
See application file for complete search history.

(56) References Cited

U.S. PATENT DOCUMENTS

| | | | |
|---|---|---|---|
| 7,471,967 B2* | 12/2008 | Kang ................... | G06F 1/1624 455/418 |
| 9,035,872 B2 | 5/2015 | Brown et al. | |
| 2005/0054303 A1* | 3/2005 | Goltermann ........ | H04M 1/0245 455/90.3 |
| 2007/0138806 A1* | 6/2007 | Ligtenberg .............. | E05C 19/16 292/251.5 |
| 2010/0277304 A1* | 11/2010 | Haartsen ........... | H04W 52/0274 340/531 |

(Continued)

FOREIGN PATENT DOCUMENTS

| | | |
|---|---|---|
| CN | 102573590 A | 7/2012 |
| CN | 102664331 A | 9/2012 |

(Continued)

OTHER PUBLICATIONS

International Patent Application No. PCT/US2016/022803—Search Report and Written Opinion dated Jun. 27, 2016.

(Continued)

*Primary Examiner* — Danny Nguyen
(74) *Attorney, Agent, or Firm* — Downey Brand LLP

(57) ABSTRACT

This application relates to devices and accessories that include or are configured to react with a mixture of electromagnets and permanent magnets. In particular the permanent magnets are configured to maintain persistent connections between components while the electromagnets are configured to pulse or activate periodically to maintain the connections or fix alignment of the various connections in certain circumstances.

18 Claims, 12 Drawing Sheets

(56) References Cited

U.S. PATENT DOCUMENTS

2013/0135067 A1   5/2013   Choi
2014/0043741 A1   2/2014   Smith et al.

FOREIGN PATENT DOCUMENTS

| CN | 103221179 A | 7/2013 |
| CN | 103678184 A | 3/2014 |
| CN | 103997929 A | 8/2014 |
| KR | 101323129 B1 | 10/2013 |
| WO | 2011126193 A1 | 10/2011 |
| WO | 2013025030 A2 | 2/2013 |

OTHER PUBLICATIONS

Chinese Patent for Utility Model No. ZL201620425662.8-P24972US1 dated on Feb. 4, 2017.

\* cited by examiner

DYNAMICALLY STABILIZED MAGNETIC ARRAY

FIELD

The described embodiments relate generally to magnetic attachment features. More particularly, the present embodiments relate to configurations in which magnetic attachment features are augmented with electromagnets.

BACKGROUND

Attachment features formed with permanent magnets offer robust and consistent attachment mechanisms for temporarily joining components together. The use of permanent magnets is generally preferable to the use of electromagnets because a permanent magnet does not require a power source. Unfortunately, because a size of the magnetic field emitted by the permanent magnets is fixed in strength and shape, a strength and or size of the magnetic field emitted by the permanent magnets oftentimes must be minimized to avoid adverse interaction between the magnetic field and nearby magnetically sensitive objects along the lines of credit card magnetic strips. For this reason, a resulting attachment force may be sufficient to maintain the components joined under normal conditions, but insufficient to keep the components joined under peak or abnormal operating conditions. For example, an unintentional bump or jostling of the coupled components may apply a force that decouples the joined components by overcoming the attachment force. Furthermore, even when a size or strength of the magnetic field is not constrained the magnetic coupling may not be strong enough to withstand certain operating conditions, because even rare earth element permanent magnets have a saturation point at which the magnetic field cannot be further increased.

SUMMARY

This paper describes various embodiments that relate to magnetic attachment features.

An electronic device is disclosed that includes at least the following elements: a power source; an electromagnet; a magnetic field sensor that includes a switch that electrically couples the electromagnet with the power source to energize the electromagnet when changes detected by the magnetic field sensor in a magnetic field fall within a predefined range of magnetic field characteristics; and a device housing enclosing the power source, the electromagnet and the magnetic field sensor.

A portable electronic device is disclosed and includes at least the following elements: a power source; a number of electromagnet assemblies, each of the electromagnet assemblies including an electromagnet, a magnetic field sensor and a switch, the switch allowing electrical energy from the power source to energize the electromagnet when the magnetic field sensor detects a magnetic field falling within a predefined range of magnetic field characteristics; and a permanent magnet configured to secure a magnetically attractable device to an exterior surface of the portable electronic device.

A portable computing device is disclosed and includes at least the following: a housing formed of a non-ferrous material; a display assembly disposed within the housing; a battery; and a number of electromagnet assemblies disposed within the housing, each of the electromagnet assemblies comprising an analog switching mechanism that supplies power to an electromagnet from the battery when a sensing coil detects a changing magnetic field meeting a predefined magnetic field characteristic.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements, and in which.

DETAILED DESCRIPTION

Figure 1A:
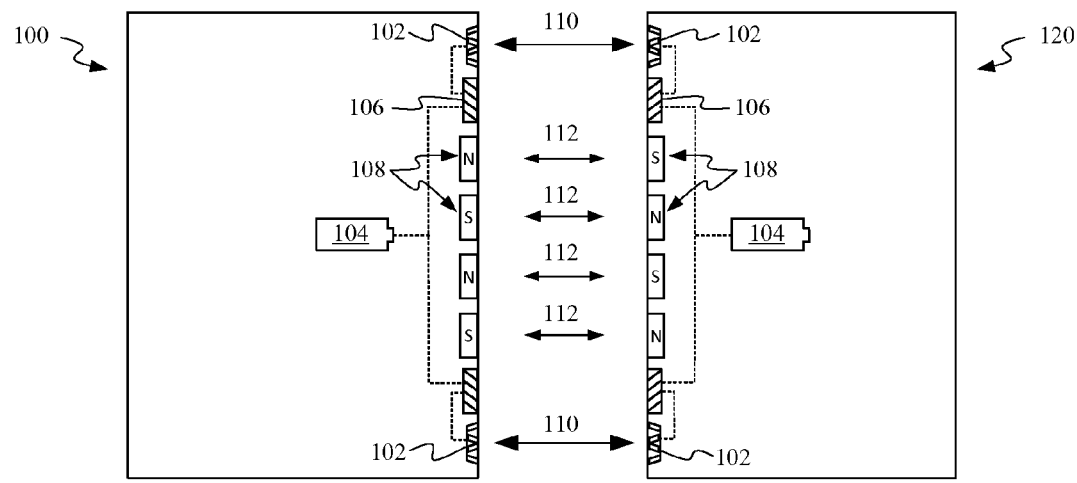
FIGS. 1A-1E show various configurations in which two components are joined using magnetic coupling features.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

High strength permanent magnets along the lines of rare earth element magnets, provide substantial, persistent magnetic fields at no power cost. Unfortunately, the fields produced by the permanent magnets are not always ideal and cannot be adapted to fit every particular situation. Unfortunately, in certain circumstances a field produced by the permanent magnet may interfere with neighboring components or devices. Furthermore, a magnetic coupling created by permanent magnets may not be strong enough to withstand certain challenging working environments in which peak forces applied to the magnetic coupling exceed the forces provided by the magnetic attraction. While electromagnets are capable of producing a substantially stronger magnetic field than even the highest strength permanent magnets and that strength can be modulated to suit various operating environments, electromagnets must be attached to a power source and steadily drain power from that power source during operation of the electromagnet.

One way to overcome the aforementioned issues is to utilize a magnetic attachment feature with both permanent magnets and electromagnets that relies primarily on the permanent magnets to maintain a persistent connection between two or more components, while periodically utilizing the electromagnets to augment the permanent magnets in certain situations. In this way, a power expenditure required by the electromagnets is minimized while the permanent magnets are augmented in situations in which the permanent magnets would otherwise be insufficient. Such a configuration beneficially allows designers to reduce a size and strength of a persistent magnetic field emitted by the permanent magnets without having to worry about disconnection of the components. In some embodiments, actuation of the electromagnets can be based upon a sensor that measures changes in the magnetic field emitted by the permanent magnets. Such a sensor can be configured to detect a change in the magnetic field resulting from initial movement of the magnets with respect to one another.

In one embodiment, the sensor for detecting relative movement between the magnets can be embodied by a sensing coil in electrical communication with a field effect transistor (FET) switch. Because the FET switch is sensitive to changes in voltage induced in the sensing coil by changes in a position of a nearby magnet field, the FET switch can be configured to activate and deactivate in response to changes in voltage that correspond to separation of two or more magnetically coupled components. In some embodiments, internal circuitry of the FET switch can be designed to actuate only in situations that correspond to unintentional separation events. For example, the FET switch can be designed to remain closed when a more gradual and small change in voltage associated with a deliberate separation is detected. In this way, the electromagnets can be actuated only when an inadvertent separation is detected. Response time of the internal circuitry can be especially timely when the FET is fully analog as the logic can all be built into the circuitry of the switch without being slowed by communications delays generally associated with digital circuitry. It should be noted that sensing coil and FET switch embodiments are used hereinafter for exemplary purposes only and should not be construed as limiting as any switch capable of detecting changes in and/or shifting of magnetic fields can utilized in lieu of the described FET switch. For example, in some embodiments the sensor can be embodied as a Hall-Effect Sensor. Other mechanical sensing mechanisms are also possible. For example, a magnet disposed on the end of a leaf spring switch could also be employed.

In some embodiments, the FET switch can also be configured to improve ways in which magnetically attractive components connect. For example, when a magnetic field associated with one component is first detected by the FET switch, the electromagnet can be configured to actuate so that a distance at which a magnetic force begins to act upon and connect with the component is increased. In other embodiments, the electromagnets could be configured to receive power in an opposite direction when disconnection of the components is desired. Such an outcome can be desirable when for example the electromagnets are configured to retain the components in all situations except when disconnection is specifically requested by way of a user interface.

In some embodiments, the FET switch can be configured to balance out a response of a protective case during a drop event, when magnetic forces generate a voltage change in the sensing coil that is indicative of a drop event. In other embodiments, other sensors such as an accelerometer can be utilized in cooperation with the FET switch to determine when the drop event has occurred. In response to such a detection, the electromagnets can be configured to emit a magnetic field that extends portions of the case away from the electronic device so that upon contacting a hard surface the electromagnets can at least partially control a rate at which the electronic device decelerates by creating a gap between the electronic device and the case that effectively acts as a thicker case during impact. Additionally once the gap between the electronic device and the case is closed the electromagnets could reverse and aid in device retention during the rebound from the initial impact. In this way, damage during the drop event can be prevented or at least reduced.

These and other embodiments are discussed below with reference to FIGS. 1A-7; however, those skilled in the art will readily appreciate that the detailed description given herein with respect to these figures is for explanatory purposes only and should not be construed as limiting.

FIGS. 1A-1E show various configurations in which two components can be temporarily joined using magnetic coupling features. In some embodiments, one or both of the components can be an electronic device. In some embodiments, the electronic device can take the form of a smartphone or tablet device having a non-ferrous or substantially magnetically neutral housing formed from a material along the lines of an aluminum alloy that surrounds and protects the described components. The different configurations depicted include ones in which permanent magnets and electromagnets are interspersed. FIG. 1A shows a configuration in which electromagnets 102 of both device 100 and 150 are positioned on both ends of one side of each device. In some embodiments, electromagnets 102 can be activated by receiving energy from power source 104 only when magnetic field sensors 106 detect a predetermined magnetic signature. In some embodiments, magnetic field sensors 106 can be configured to recognize any one of a number of magnetic signatures. In this particular embodiment, magnetic field sensors 106 disposed within device 100 can be configured to recognize a changing magnetic field consistent with permanent magnets in a configuration similar to permanent magnets 108 of device 150 approaching device 100. Once the magnetic signature reaches a predetermined strength, magnetic field sensors 106 can be configured to engage a switch that allows energy stored within power source 104 to energize electromagnets 102. As depicted, the dotted lines show how electromagnets 102 can be coupled with power source 104 by way of magnetic field sensor 106. By including a switching device in magnetic field sensor 106, magnetic field sensor 106 can electrically couple electromagnets 102 with power source 104 by actuating the switching device as soon as a predefined stimulus is detected by magnetic field sensor 106. It should be noted that this configuration allows two devices such as devices 100 and 150 with the same or substantially similar magnetic configurations to be joined together. For example, FIG. 1A shows how devices 100 and 150 have substantially the same magnet configuration, meaning that by rotating one of the items by 180 degrees the devices can be coupled together. FIG. 1A also shows how magnetic attraction forces 110 between electromagnets 102 can be substantially greater than the magnetic attraction force 112 between permanent magnets 108. Depending on an amount of energy supplied by power source 104, the forces provided by electromagnets 102 can vary greatly. In some cases the force provided can be less than that provided by the permanent magnets and in other cases the force provided by the electromagnets can be an order of magnitude greater than the force provided by the permanent magnets.

Figure 1B:
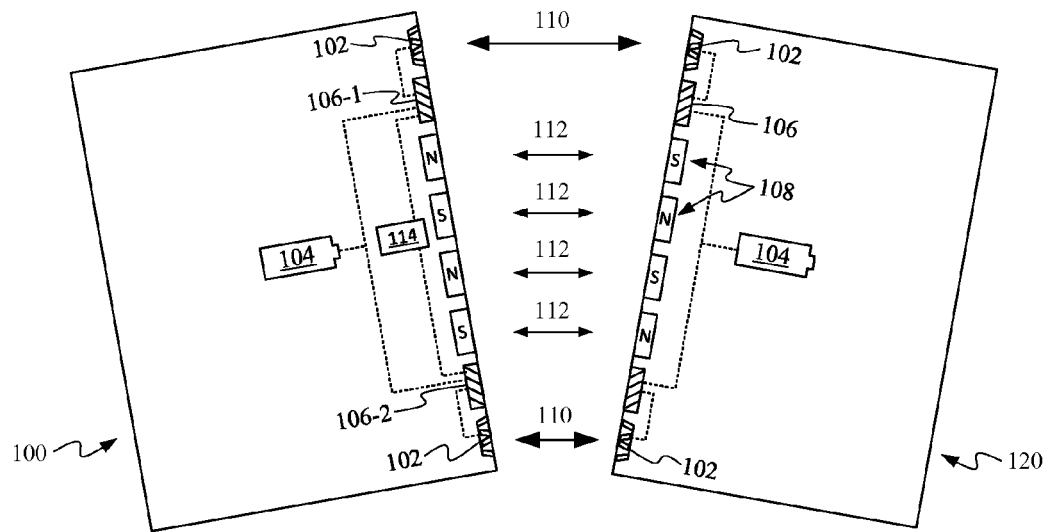

FIG. 1B shows a situation where a differential field strength can be considered when supplying power to electromagnets 102. For example, in the depicted embodiment, readings from magnetic field sensor 106-1 would tend to be substantially greater than readings from magnetic field sensor 106-2. Without a comparator circuit 114, magnetic field sensor 106-2 would tend to actuate its corresponding electromagnet 102 prior to magnetic field sensor 106-1. By adding comparator circuit 114 to compare inputs received from each of magnetic field sensors 106-1 and 106-2, comparator 114 can cause actuation of electromagnet 102 by magnetic field sensor 106-2 to be delayed while actuation of electromagnet 102 by magnetic field sensor 106-1 can be commanded without delay. In this way, the sides of devices 100 and 120 can be brought together in a much flatter orientation. This type of orientation normalizing can be beneficial when, for example, the devices are configured with connectors that require a particular orientation to couple together. In some embodiments, the nearer magnetic field sensor 106-2 can be configured to command its associated electromagnet 102 to exert a repulsive force when a difference between magnetic field sensors 106-1 and 106-2 is particularly great. It should be noted that the variance of electromagnet output based upon differential magnetic field sensor data can be applied to any of the described embodiments that include multiple magnetic field sensors.

Figure 1C:
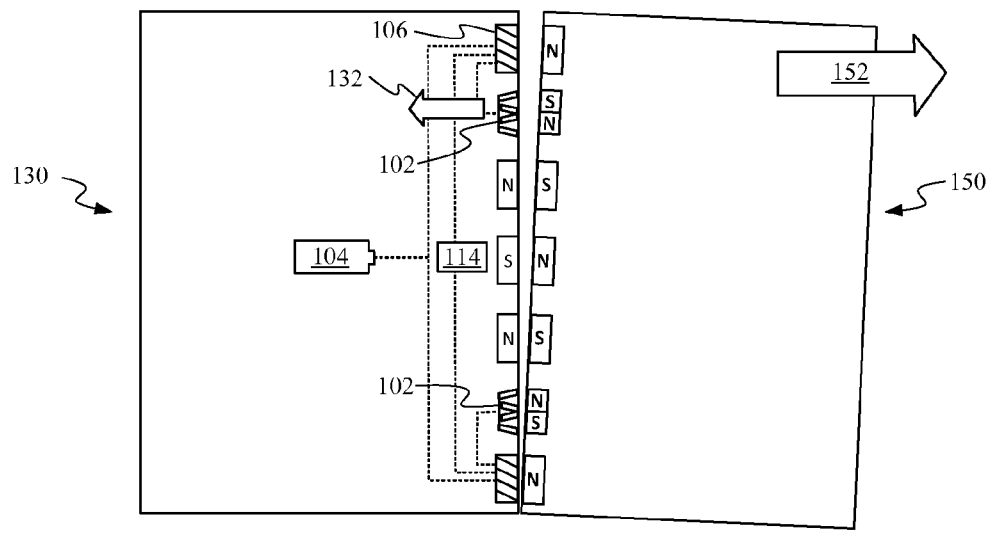

FIG. 1C shows a configuration in which electromagnets 102 are only included in electronic device 130 and accessory device 150 includes only permanent magnets and magnetically attractable material. In this way, accessory device 150 without the electromagnets need not include a power source to actuate electromagnets. FIG. 1C also shows how sensors 106 can be arranged at either end of device 170, allowing them to be separated by a substantial distance. In this way, differential data received by comparator 114 from sensors 106 can be accentuated. It should also be noted that electronic device 130 can have a symmetric magnetic configuration, thereby allowing accessory device 150 to be attached to electronic device 130 in at least two different orientations. FIG. 1C also depicts a configuration in which accessory device 150 is magnetically coupled with electronic device 130. When separation force 152 is applied asymmetrically to one end of accessory device 150, electromagnet 102 can be energized by actuation of FET circuitry associated with magnetic field sensor 106, thereby causing force 132 to be generated at electromagnet 102. When force 152 is an abruptly applied force, force 132 generated by electromagnet 102 can be correspondingly short in duration to counter force 152. In some embodiments, when force 152 is a long steady pull rather than an impulse, then the FET circuitry can be configured to ignore an relatively slow changing magnetic field associated with the steady pull.

Figure 1D:
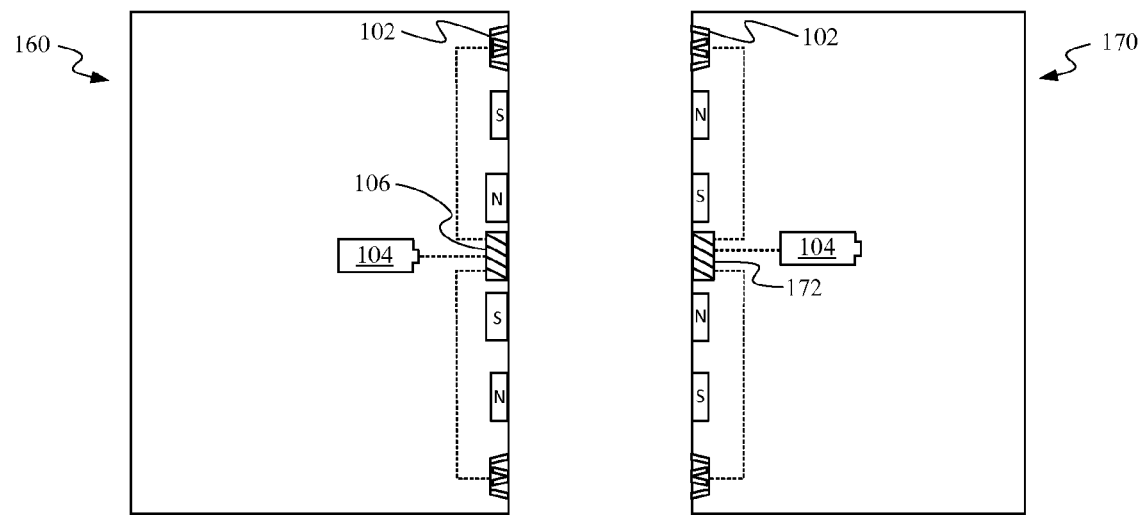

FIG. 1D shows an additional alternative configuration in which magnetic field sensor 106 takes the form of a single FET switch and sensor coil combination that is positioned in the middle of one side of electronic device 160 for detachment, detection and actuation operations executed by both electromagnets 102. In this way, fewer sensors need be included in the design. Furthermore, the single FET switch configuration can be actuated in accordance with magnetic field readings received from a single sensor so the data need not be cross-checked. In some embodiments, a more complex FET switch can be used that can characterize an orientation of the magnetic field emitted by electronic device 170. In this way, varied actuation of electromagnets 102 can still be commanded based on a determined orientation of a magnetic field emitted by electronic device 180. In some embodiments, a magnetic sensor 172 associated with electronic device 170 can be configured differently than the magnetic field sensor of electronic device 170. For example, actuation of electromagnets 102 of electronic device 170 can be delayed until actuations of electromagnets 102 of electronic device 160 are detected by magnetic field sensor 172. In this way a more complex, higher cost magnetic field sensor 106 can be included in a primary device while a lower cost magnetic field sensor 172 can be included in electronic device 170.

Figure 1E:
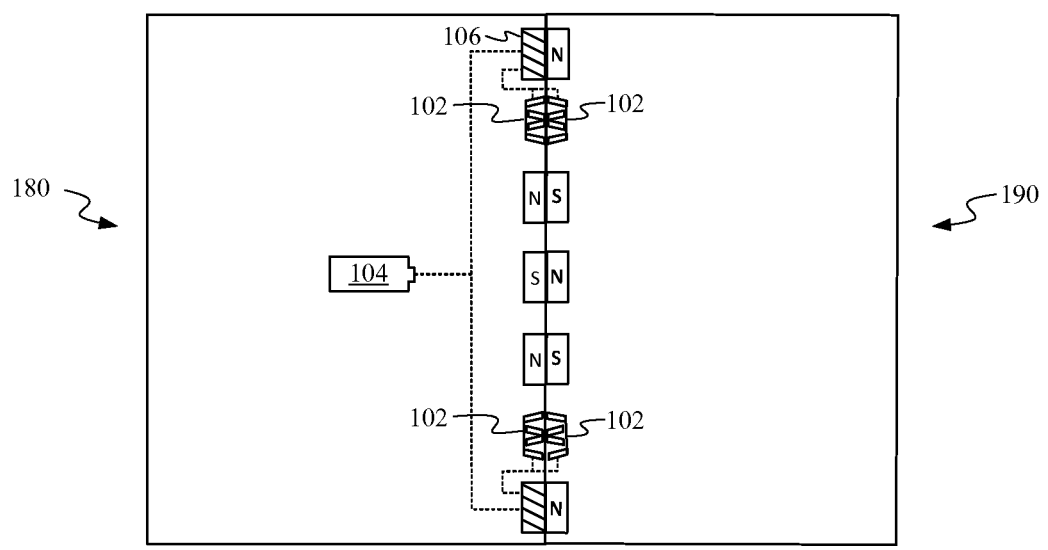

FIG. 1E shows an additional embodiment in which electronic device 180 includes power source 104 while electronic device 190 does not. In this embodiment power source 104 is configured to supply power to electromagnets in both electronic device 180 and 190. Dotted lines running from magnetic field sensor 106 show how energy from power source 104 can be routed between the devices. The inter-device energy transfer can be enabled in any of a number of ways including, for example by discrete electrical connectors or in some cases by inductive energy transfer. While reliance upon power source 104 of electronic device 180 for energizing of electromagnets 102 of electronic device 190 can limit the number of situations in which electromagnets 102 of electronic device 190 can be employed, those electromagnets are still formed of magnetically attractable materials which can interact with attraction fields emitted by magnets within electronic device 180. While electromagnets are shown in both devices it should be understood that in some embodiments, electronic device 180 may include no electromagnets at all and can rely completely upon energizing of electromagnets 102 of electronic device 190.

Figure 2A:
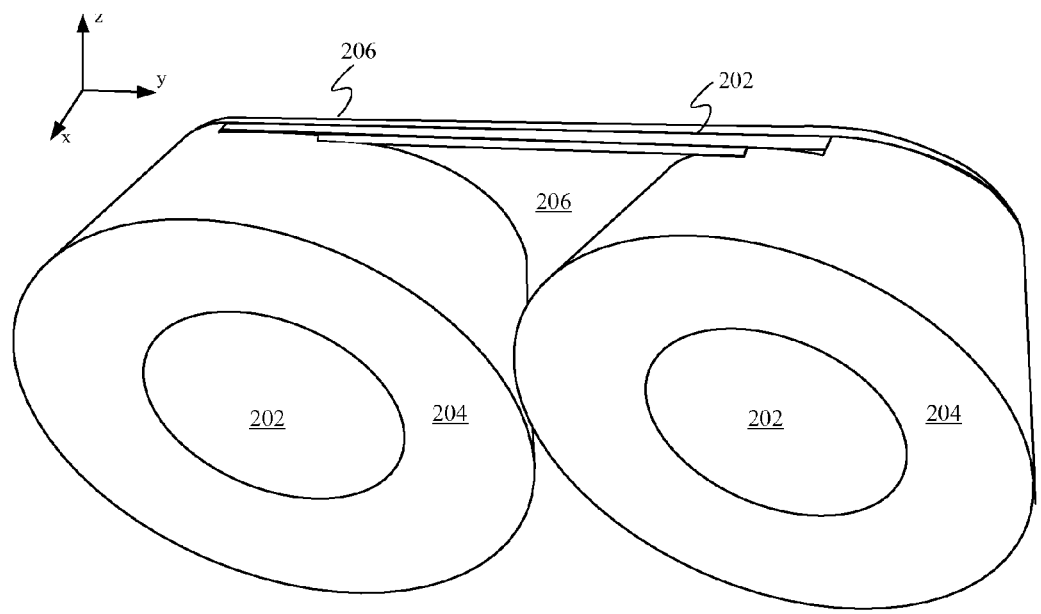
FIGS. 2A-2B show perspective and cross-sectional views of an electromagnet.
Figure 2B:
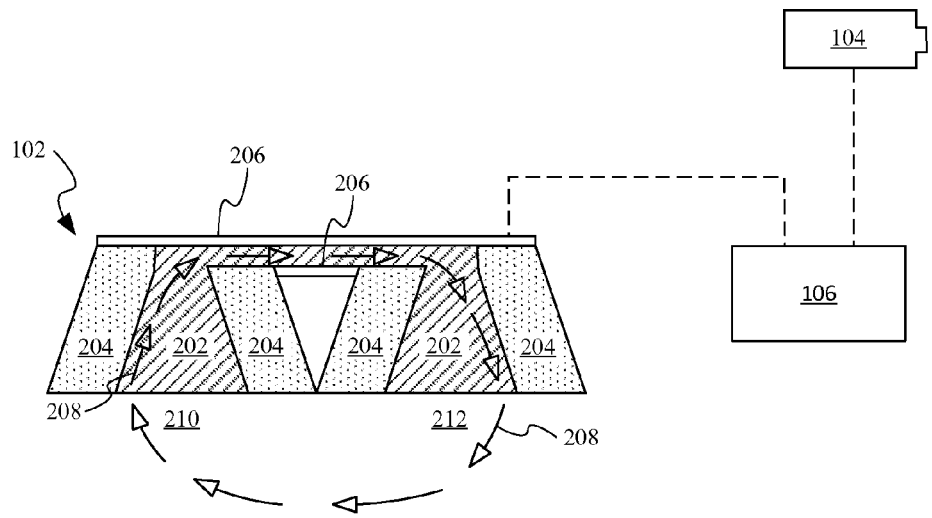
Figure 2C:
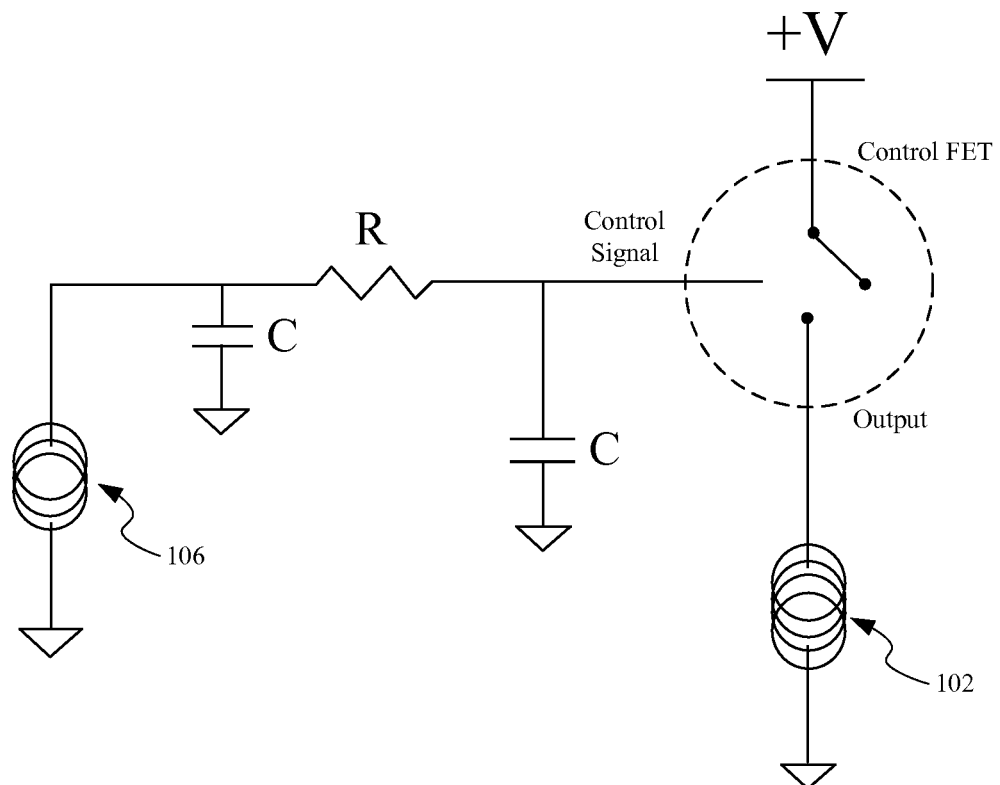
FIGS. 2C-2D show circuit diagrams depicting how the magnetic field sensor can be configured.

FIGS. 2A-2C show perspective and cross-sectional views of one of electromagnets 102. In particular, FIG. 2A shows a perspective view of electromagnet 102. As depicted, electromagnet 102 is formed from a magnetically attractable substrate 202 substantially wrapped within coils 204. Coils 204 can be formed of wires having a wire diameter of between 0.06 mm and 0.25 mm and in some embodiments have an average wind diameter of about 5 mm. Actuation of coils 204 by a power source can create a magnetic field that creates field lines extending through magnetically attractable substrate 202. In some embodiments, magnetically attractable substrate 202 can include any one of a number of metals including stainless steel and mu metal arranged in any number of shapes. The figures depict magnetically attractable substrate 202 as having a u-shaped geometry. In some embodiments, magnetically attractable substrate 202 can be a magnetized magnetic substrate along the lines of rare earth metal magnets or ferromagnetic compounds. A magnetic substrate has the advantage of providing a persistent magnetic field even without receiving current; however, in certain cases a stainless steel or mu metal substrate can generate a much larger magnetic field than a magnetic substrate since the magnetic field saturation level for mu metal and stainless steel is substantially higher than saturation levels for magnetic substrates. When coils 204 receive electrical energy in the form of electrical current a magnetic field can be emitted. Magnetically attractable substrate 202 is surrounded by coils 204 so that when current is routed through coils 204, magnetically attractable substrate 202 acts to help magnify the magnetic field generated by coils 204. In some embodiments, the coils can be configured as depicted maintaining about the same thickness of wires and broadening as magnetically attractable substrate 202 broadens near a base of electromagnet 102. Electromagnet 102 also includes elements 206 that can be configured to help insulate magnetically attractable substrate 202 and a magnetic field it conducts from other nearby magnetically sensitive components.

FIG. 2B shows a cross-sectional view of electromagnet 102 and how magnetically attractable substrate 202 can direct a magnetic field represented by field lines 208 through electromagnet 102. In this way, a magnetic field in region 210 can be oriented in a direction opposite to region 212. FIG. 2B also shows how electromagnet 102 is in electrical communication with magnetic field sensor 106. In some embodiments, FET circuitry of magnetic field sensor 106 can be arranged so that a rate at which magnetic field induced voltage changes within the FET circuitry corresponds to whether or not the switching mechanism of the FET circuitry is actuated. For example, in some embodiments, FET Circuitry of magnetic field sensor 106 is configured to respond to a change in voltage induced by shifting of magnetic fields in various ways. In one configuration, the FET circuitry of magnetic field sensor 106 can be configured to filter out magnetic field changes consistent with a slow continuous force applied to an accessory device. In such a configuration the FET circuitry can be arranged to actuate electromagnets 102 when a changing magnetic field is detected that is consistent with a quick pull or jostle imparted to the accessory device. In this way a rapid energizing of electromagnet 102 sufficient to prevent separation of the accessory device can be commanded, while an intentional removal consistent with the continuous pull on the accessory device can be accomplished without energizing electromagnets 102. For example, such a configuration can be useful when operating an electronic device on a moving platform such as a commuter bus or train. When the moving platform travels over a bump or switches tracks, resulting transitory forces applied to the device and accessory can be opposed by rapid actuation of electromagnets 102. Unfortunately, in certain circumstances this type of configuration can allow disconnection of the accessory device when unintentional persistent forces are applied. Such a disconnection may be preferable to a system that would actuate electromagnets 102 over a long period of time to oppose the unintentional persistent force because persistent actuation of electromagnets 102 can unduly drain a battery of the device to which the accessory device is magnetically coupled.

FIG. 2C shows an exemplary layout of an analog FET circuit switch suitable for use with the described embodiments. Variation in resistance and capacitance of the depicted elements can help to tune a response of FET Circuitry of the Control FET to changes in voltage experienced across a sensing coil taking the form of magnetic field sensor 106 caused by shifting magnetic fields. In some embodiments, the depicted FET circuitry can act as a band pass filter that both helps the FET circuit avoid false triggers and limits the duty cycle so an expenditure of power to the magnets can be limited so as to not unduly reduce battery life of the device with which the electromagnet is associated. It should be noted that the band pass filter is not a requirement for driving a FET circuit with a sensing coil, and in certain applications a direct connection between magnetic field sensor It should be noted that while FIG. 2C shows a fully analog circuit, other digital circuitry can be included. For example, in some embodiments an additional switch can be incorporated that routes power to electromagnet 102 based upon signals passed digitally. Such a configuration can be beneficial when actuation of electromagnet 102 is based upon additional sensors provided by digital circuits, the output of which can be combined and analyzed by a processor for determination of whether or how much to energize any one of electromagnets 102. In some embodiments, the other switch configurations can include inputs from a magnetometer or accelerometer of an associated device.

Figure 2D:
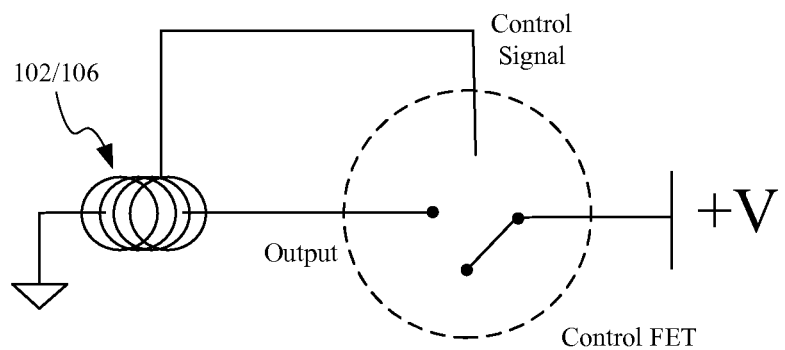

FIG. 2D shows an alternative layout for the switch circuitry. In particular FIG. 2D shows a simplified layout in which magnetic field sensor 106 and electromagnet 102 are combined and the band pass filter is omitted. Magnetic field sensor 106 can be included with electromagnet 102 by configuring the coils that energize electromagnet 102 as a sensing coil. In this way, voltage changes in the electromagnet coil caused by changing or shifting magnetic fields can be utilized to actuate and deactivate the FET switch. Alternatively, electromagnet 102 can include a second set of coils wrapped around it that are configured to measure voltage changes resulting from magnetic field changes. This configuration effectively allows electromagnet 102 to both sense and generate magnetic fields.

Figure 3A:
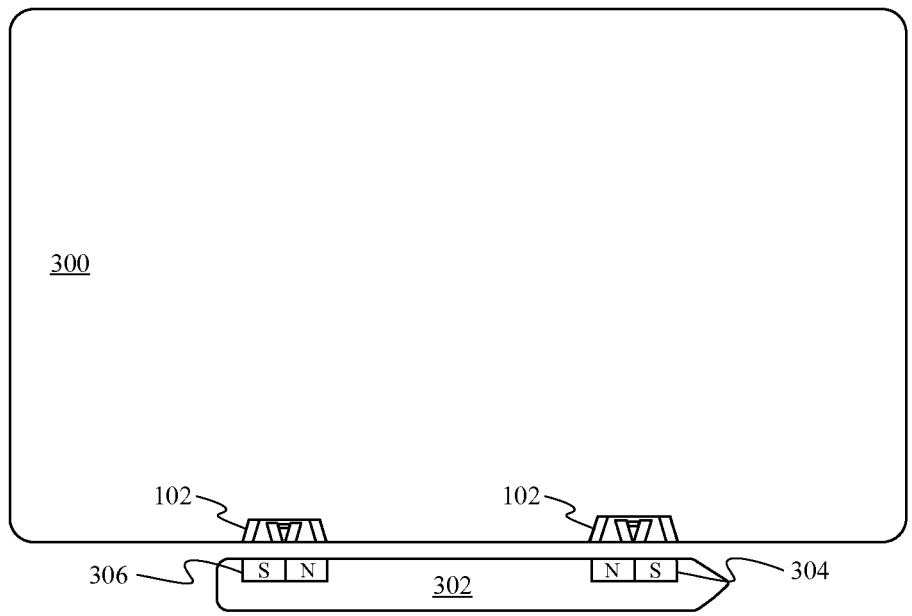
FIGS. 3A-3B show various implementations of a tablet device that include sensor actuated electromagnets that can be configured to actuate upon detecting a magnetic field consistent with a stylus or span device.
Figure 3B:
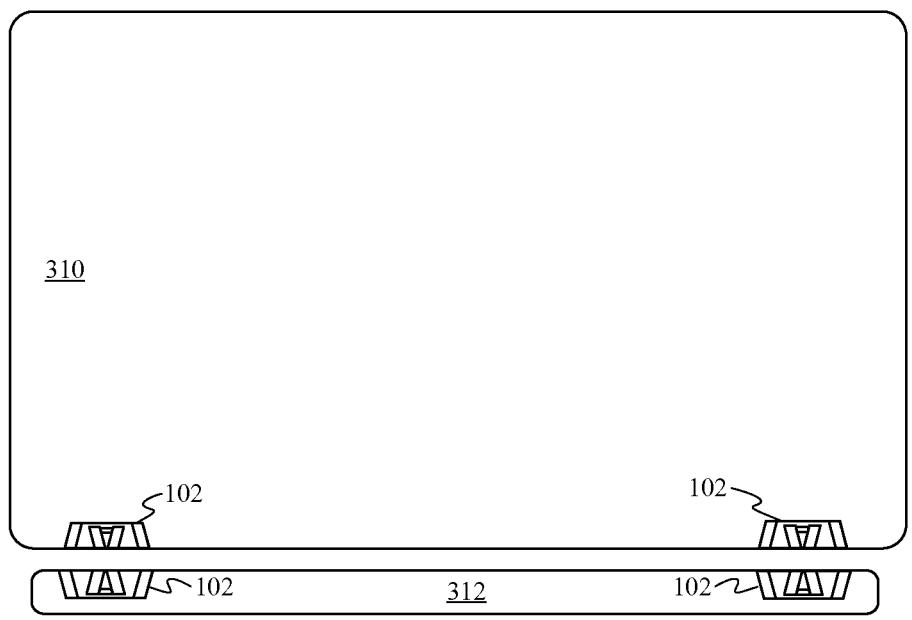

FIGS. 3A-3B show various implementations of a tablet device that include sensor actuated electromagnets that can be configured to actuate upon detecting a magnetic field consistent with a stylus or span device. FIG. 3A shows stylus 302 having permanent magnet arrays 304 and 306 affixed to one side of tablet 300. In some embodiments, an orientation sensor within stylus 302 can be utilized to maintain an orientation of stylus 302 consistent with an orientation of tablet 300 by varying magnetic fields emitted by electromagnets within stylus 302 or by modulating magnetic fields emitted by electromagnets 102 disposed within tablet 300. This type of system can be embodied in any number of ways. For example, in some embodiments, when stylus 302 and tablet 300 are in communication by way of a wired or wireless connection (such as a Bluetooth® connection) orientation sensors in both the tablet and the stylus can be compared to determine whether alignment of stylus 302 is required. When misalignment is detected electromagnets 102 can emit a quick pulse that guides magnets within stylus 302 into a predefined position. Alternatively the quick pulsing can be periodically emitted whenever a stylus is in wireless communication with tablet 300. In some embodiments, this can maintain stylus 302 in a substantially parallel orientation with respect to a surface of tablet 300. In some embodiments, tablet 300 can be configured to activate electromagnets 102 to initiate connection or disconnection of stylus 302. While not specifically depicted, tablet 300 can include permanent magnets for maintaining stylus 302 against an outer surface of tablet 300. In this way, electromagnets need not stay energized to retain stylus 302 in contact with tablet 300.

FIG. 3B shows another optimization of a magnetic connection for a stylus or span connector in which an orientation of the stylus or span device can be corrected to align with an associated electronic device. In some embodiments, tablet 310 can include magnetic flux detection sensors configured to activate electromagnets 102 upon a magnetic field associated with span 312 emitting a magnetic flux having a minimum predetermined magnetic flux. The minimum magnetic flux level can be consistent with a distance at which electromagnets 102 can quickly draw span 312 towards tablet 310.

Figure 4A:
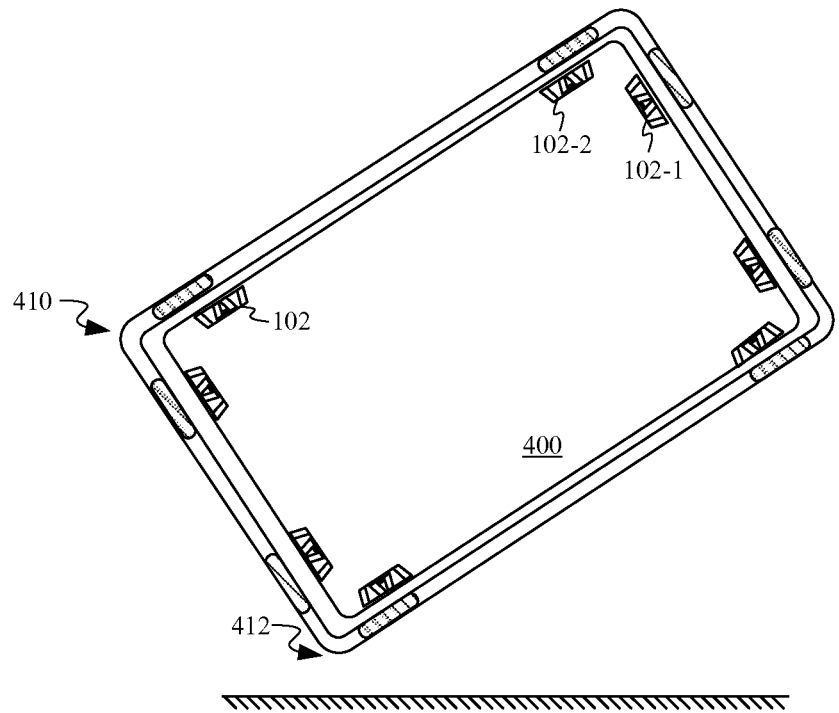
FIG. 4A shows a configuration in which electromagnets of a device can be configured to interact with permanent magnets and/or magnetically attractable material embedded within a protective case to reduce damage to the device in the event of a fall.

FIG. 4A shows an implementation in which electromagnets 102 of a device 400 can be configured to interact with permanent magnets and/or magnetically attractable material embedded within a protective case 410 to reduce damage to the device in the event of a fall. Sensors of device 400 along the lines of accelerometers and/or gyroscopes can be configured to determine any time device 400 is in free fall. When device 400 is able to determine a most likely point of impact a position of device 400 within protective case 410 can be adjusted by activating select ones of electromagnets 102. The magnetically attractable material of protective case 410 can include magnetically attractable or magnetized material. In some embodiments, the magnetically attractable material can include a flexible steel shell that can be manipulated by electromagnets 102 of device 400 so that a distance between corner 412 of protective case 410 and device 400 can be maximized by engaging electromagnets 102-1 and 102-2 of device 400 to maneuver device 400 towards a top-most corner of protective case 410 as depicted in FIG. 3D. In some embodiments instead of forming all of protective case 410 of magnetically attractable material only discrete elements 414 can be magnetically attractable or magnetic.

Figure 4B:
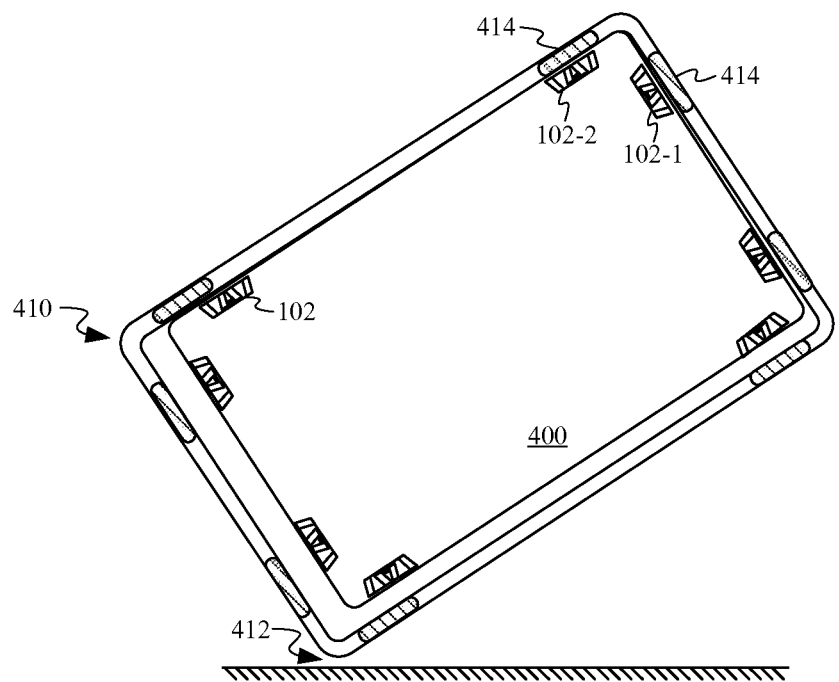
FIG. 4B shows how electromagnets can shift a device towards magnetically attractable elements of protective case during the fall.

FIG. 4B shows how electromagnets 102-1 and 102-2 bias device 400 towards magnetically attractable elements 414 of protective case 410. Once corner 412 of protective case 410 impacts a hard surface the space between protective case 410 and device 400 forms a crush zone that reduces a rate at which force from the impact is imparted to device 400, thereby reducing a likelihood of damage. In some embodiments, power supplied to electromagnets 102-1 and 102-2 can be slowly reduced to further be controlled. This can be particularly effective once the established crush zone has flattened and no longer has any give left as it can allow even greater control over a rate of deceleration. FET switches within device 400 can be utilized to determine when movement of device 400 with respect to protective case 410 exceeds a predetermined threshold. Such a detection even by the FET switches can be used to adjust motion of device 400 with respect to protective case 410 by activating select electromagnets 102. It should be noted that while an embodiment in which a corner impacts a solid surface is depicted the described embodiments can also be applied in drop event situations where substantially all of one side of protective case 410 impacts a hard surface. Furthermore, in certain embodiments, a FET switch along the lines of those previously described can be used to determine if device 400 is in the process of being disengaged from protective case 410 by monitoring voltage changes within a sensing coil with which the FET switch is in electrical contact. In such a case, all or an appropriate number of electromagnets 102 can be pulsed to retain device 400 within protective case 410.

Figure 5A:
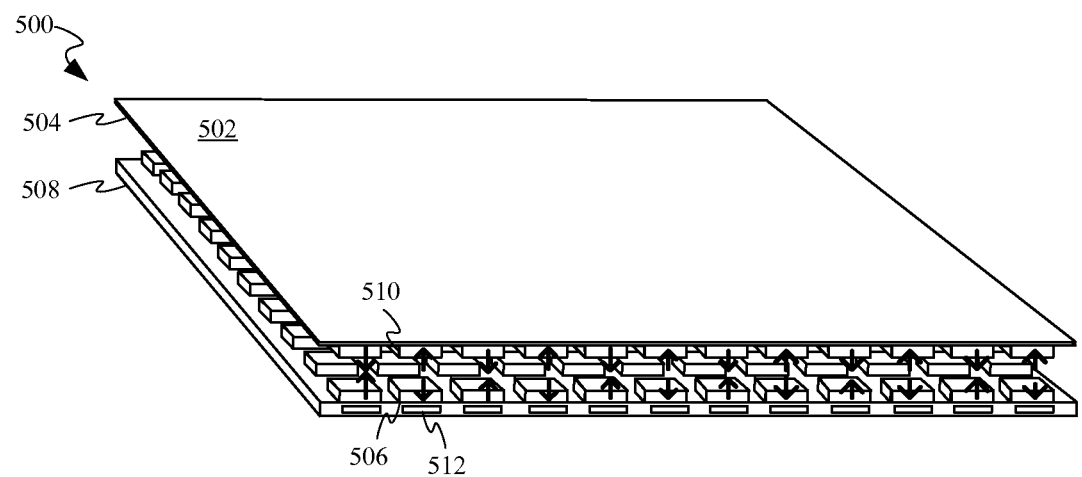
FIGS. 5A-5E depict a number of embodiments taking the form of various input devices.

FIGS. 5A-5D depict a number of embodiments taking the form of various input devices in accordance with the described embodiments. In particular, an input device 500 configured to provide visual and tactile feedback to a user is depicted. Input device 500 can provide visual feedback by way of a flexible display 502 secured to a top surface of top layer 504 of input device 500. FIG. 5A also shows internal elements within input device 500 by removing a flexible covering that would otherwise mask the edges of input device 500. As depicted, an array of magnetic elements 506 are shown dispersed along an interior facing surface of bottom layer 508 of input device 500 while another array of magnetic elements 510 are dispersed across an interior facing surface of top layer 504. FIG. 5A shows a configuration in which the arrays of magnetic elements 506 and 510 are arrays of permanent magnets that have alternating polarities configured to exert repulsive magnetic fields that force substantially all of top layer 504 of input device 500 into a substantially planar configuration. FIG. 5A also depicts an array of electromagnets 512 embedded within bottom layer 508. Electromagnets 512 can be configured to produce an attractive field substantially larger than the repulsive field so that after a portion of top layer 504 has been depressed by a predefined amount, the electromagnet then energizes and draws an associated magnetic element 510 into contact or close proximity to an associated magnetic element 506. Electromagnet 512 can be equipped with a discrete magnetic field sensor along the lines of a FET switch as described above to determine when the particular distance has been reached. In some embodiments, a reduction in size can be achieved by integrating a sensing coil associated with the FET switch into an associated electromagnet 512. In this way, positive feedback can be provided to assure a user that an input has been detected. It should be noted that in some embodiments, arrays of magnetic elements 506 and 510 can be arranged in a configuration that allows top layer 504 to be compressed against bottom layer 508 by shifting top layer 504 or bottom layer 508 laterally to align the various magnetic elements. In this way, attractive forces are generated drawing the two layers together to form a low-Z form factor input device 500 that can be easily stored or otherwise positioned when not in use.

Figure 5B:
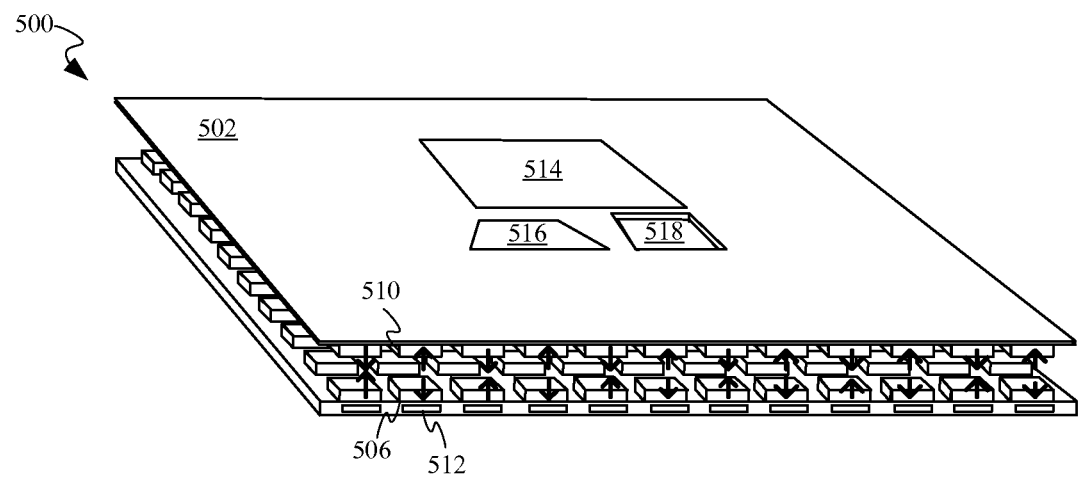

FIG. 5B shows how flexible display 502 can be configured to indicate various areas of top layer 504 that define user inputs. When a touch is detected by a touch sensor of display 502 within one of the indicated areas, such as one of areas 514, 516 or 518, magnetic elements 506 and 510 lying beneath the indicated area in which the touch is detected can be coupled together, so that when one of magnetic elements 510 is compressed electromagnets 512 drive the other magnetic elements 510 to follow the magnetic element receiving the force. Area 518 is depicted in an actuated state in which multiple magnetic elements 510 move together to provide the appearance of a large key being temporarily depressed in response to a user input. While a generic pattern of buttons is depicted it should be understood that any desired pattern of keys can be defined by flexible display 502 and the magnetic element arrays.

Figure 5C:
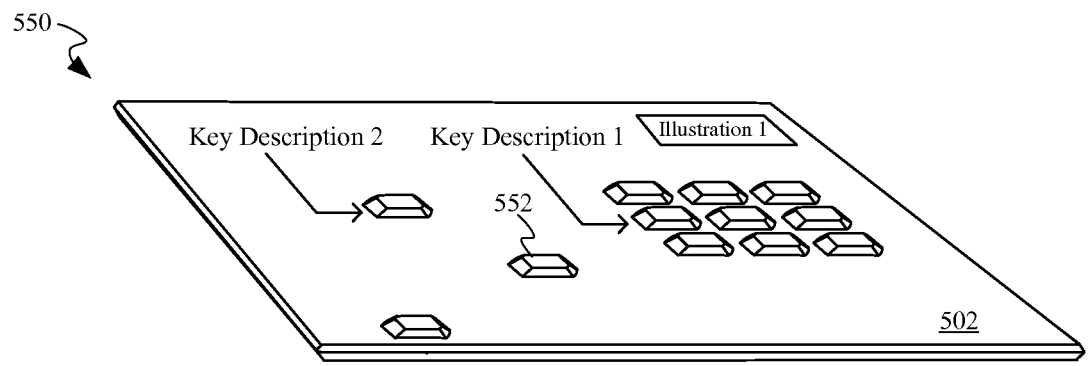
Figure 5D:
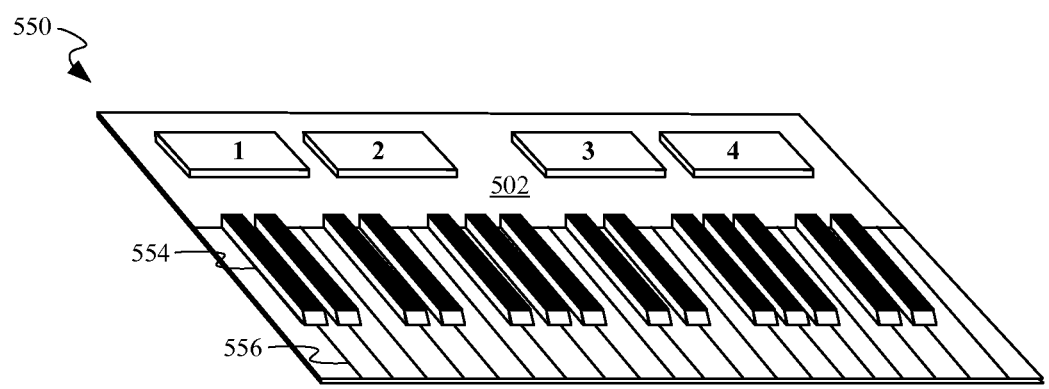

FIGS. 5C and 5D show an alternative input device 550 that includes electromagnets on at least an interior facing surface of a bottom layer of input device 550 that cooperate with permanent magnets attached to a top layer of input device 550 to control contours of input device 550. The electromagnets within input device 550 can be selectively actuated to define various control schemes. FIG. 5C shows an exemplary control scheme in which protrusions formed by commanding certain combinations of the electromagnets to be energized. In some embodiments, each key can correspond to a discrete electromagnet and permanent magnet exerting opposing magnetic fields upon one another. Input device 550 can be wrapped in many different materials such as plastic, fabric or even microfiber. In some embodiments, a single key can be formed of multiple pairs of magnetic elements 506 and 510. In this way, a larger key having a customized shape can be created. In some embodiments, a tactile response of each key can be driven entirely by an amount of current supplied to each electromagnet. FIG. 5C also shows how display 502 can be configured to provide information about various ones of the keys as can be seen by key descriptions 1 and 2. In some embodiments, display 502 can also include illustration 1 as depicted. Illustration 1 can include any decorative or functional imagery having any amount of utilitarian or cosmetic value. Each of keys 552 can be configured to provide tactile feedback to a user when the user exerts a force on a particular key 552. For example, in some embodiments a click feel can be desired in which resistance is initially great and then the resistance is reduced to allow the key to descend before it returns to its former position. In some embodiments, each key can be configured to respond in a particular way in all circumstances, while in other embodiments, feedback response can be varied depending on a chosen application or user interface layout.

For example, in some embodiments, input device 400 can be configured to display a piano style keyboard interface as depicted in FIG. 5D. In a piano configuration, the keyboard would be made up of two types of keys, black keys 554 and white keys 556. In some embodiments, only black keys 554 can be elevated while white keys 556 are defined only by visual cues provided by display 502. In some embodiments, white keys 556 can be elevated only half as much as black keys 554, so that tactile feedback can be provided for each key of the keyboard. In some embodiments, corresponding combinations of electromagnets and permanent magnets can be larger or smaller depending upon an amount of resolution desired when defining three-dimensional shapes upon input device 550. While a piano layout is depicted other embodiments are also possible such as for example a drum layout or in some cases a standard keyboard layout.

Figure 5E:
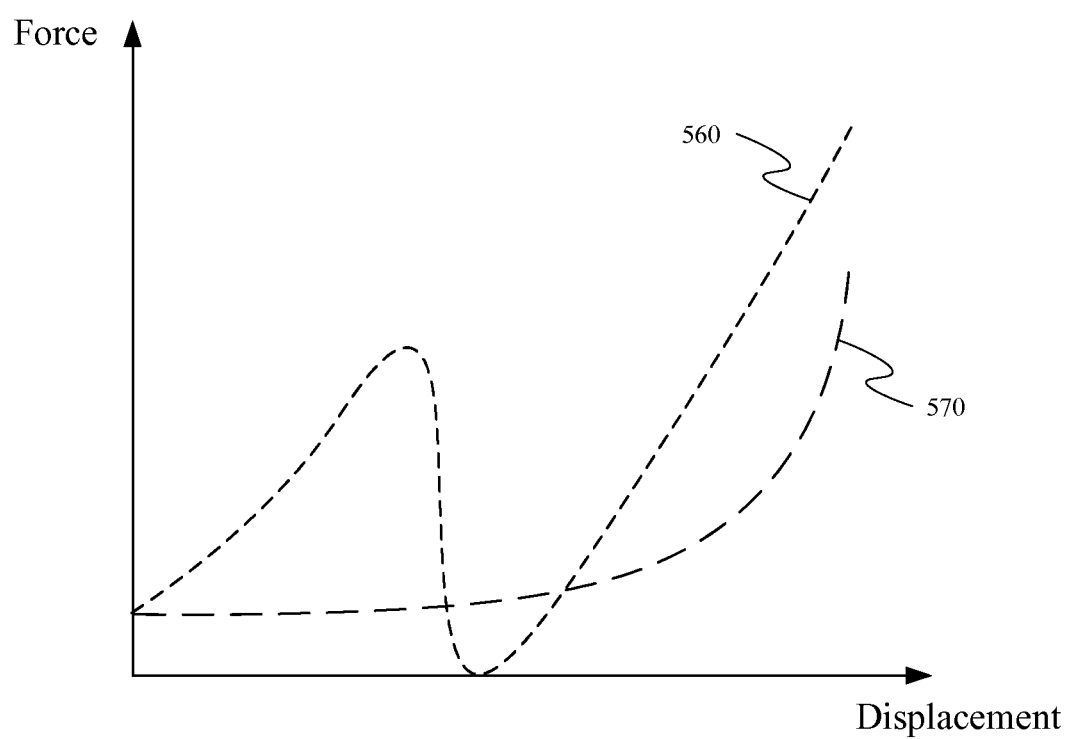

FIG. 5E shows various feedback response profiles that can be commanded in accordance with the described embodiments. Feedback response profile 560 can appropriate for use with the button embodiments described in FIGS. 5A-5C. Repulsion by magnetic fields creates an initial increase in resistance; however once a certain amount of displacement is achieved an electromagnet is actuated which draws the keyboard down for a very satisfying user indication that the keystroke has been received. The described embodiments can provide superior feedback response on the order of a 1:1 feedback ratio, because unlike a more traditional dome switch, the slope of the curve once sufficient force has been applied can be extremely steep, as depicted by response profile 560. By providing such a definite feedback response an amount of travel of each key or button can be reduced without preventing a user from receiving unmistakable feedback of key or button actuation. FIG. 5E also shows response profile 570. This response profile might be appropriate for use with a variable feedback key such as the piano keyboard depicted in FIG. 5D. The slow ramp up in pressure to depress the key can be consistent with a real piano. It should be noted that the response profiles should not be construed as limiting and that electromagnet driven buttons and keys can assume many different profiles to match many different user interface configurations. In some embodiments, a device attached to input device 500 or 550 can be configured to transmit a different user interface scheme and control feedback for any one of a number of applications.

Figure 6:
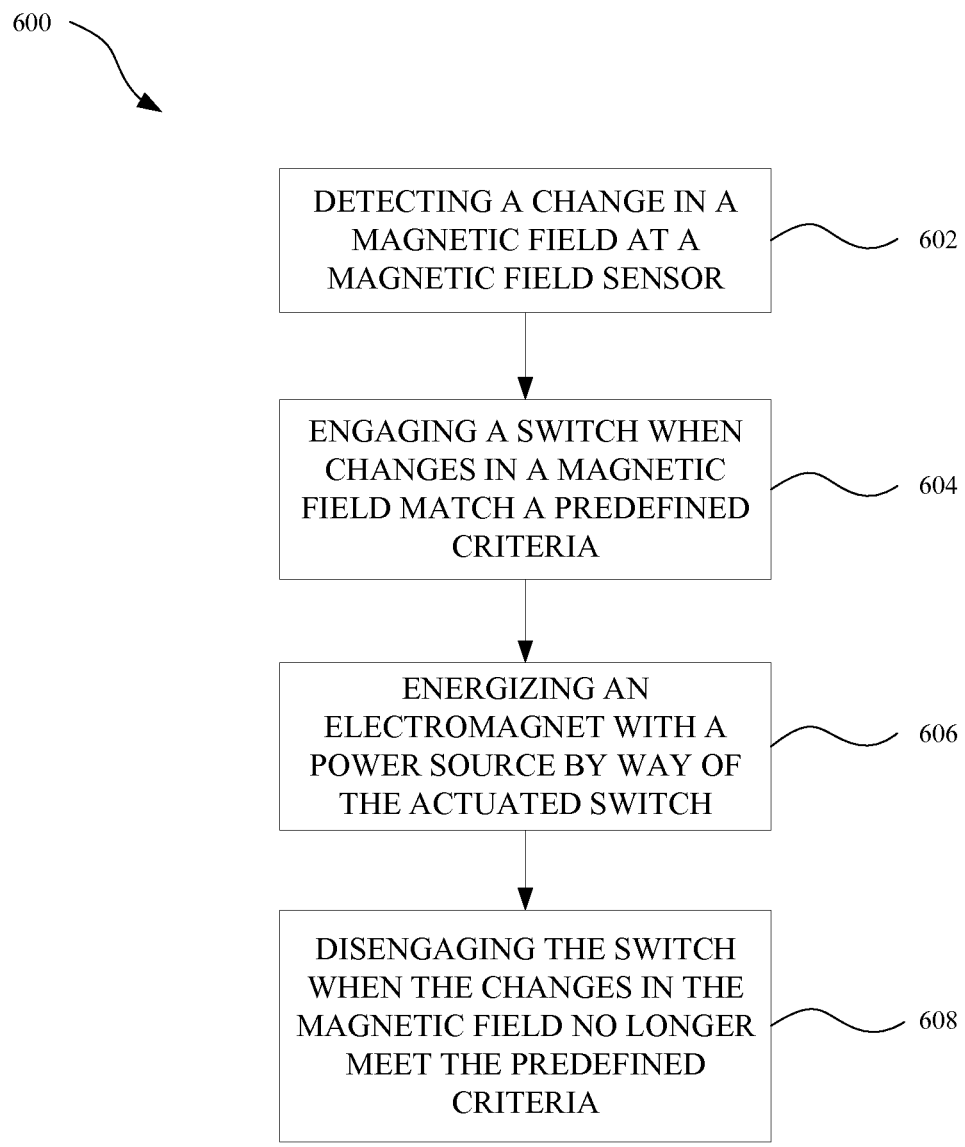
FIG. 6 shows a flow chart illustrating a method for detecting changes in a magnetic field.

FIG. 6 shows a flow chart illustrating a method 600 for detecting and reacting to a changing or shifting magnetic fields. At step 602 a changing magnetic field is detected. The changing magnetic field can be detected in many ways, but in one embodiment a sensing coil combined with a FET switch can be used to detect and react to changes in magnetic fields. Circuitry within the FET switch can be adjusted to filter out certain types of magnetic field changes. At step 604, when the changing magnetic field matches a predefined magnetic field profile a switch is engaged. At step 606, engagement of the switch energizes an electromagnet. The energized electromagnet can be configured to perform many tasks including preventing disconnection of an accessory from a device, initializing a connection between two devices, or even providing a tactile response to a user input to a name a few. At step 608, when the changing magnetic field no longer matches the predefined magnetic field profile the electromagnet is de-energized.

Figure 7:
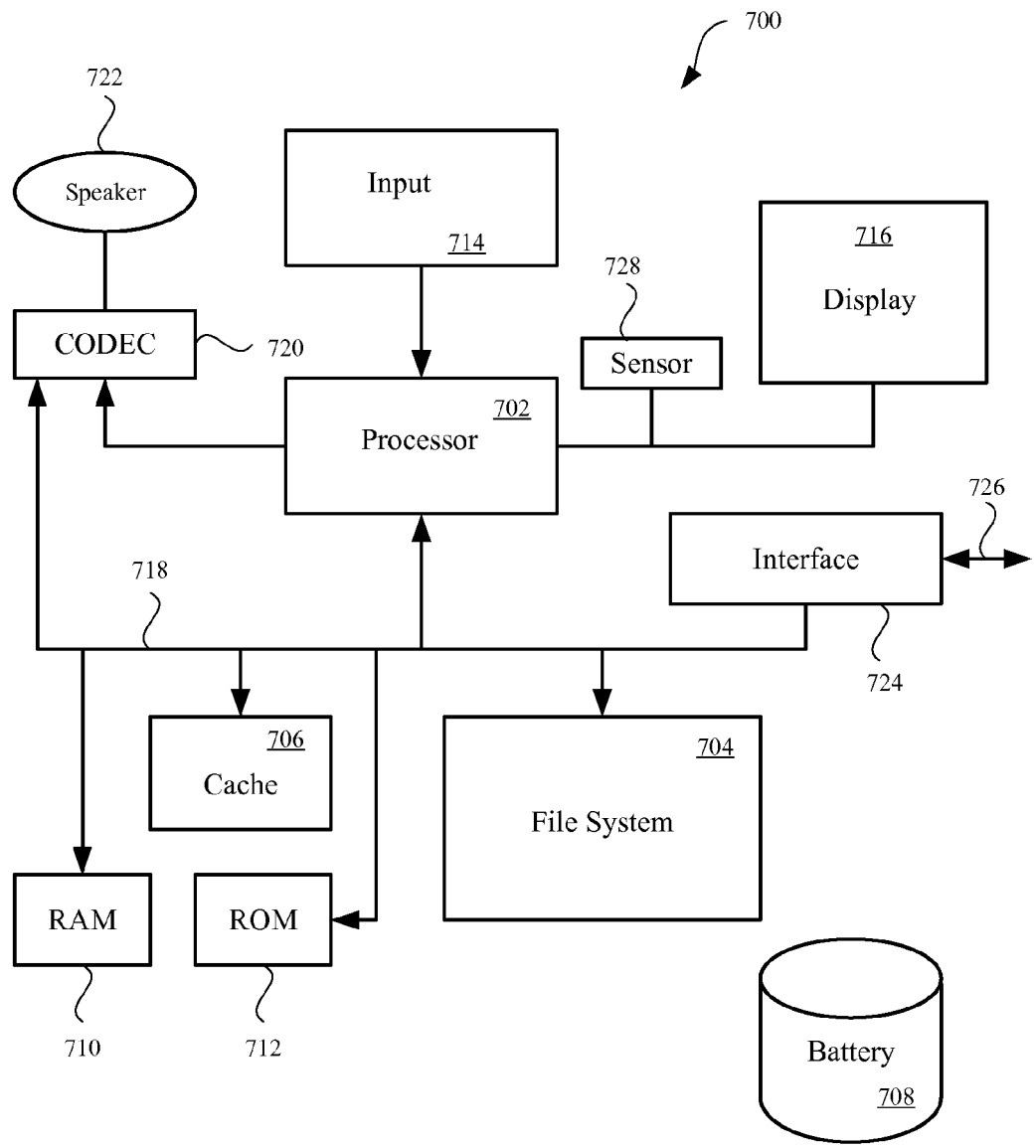
FIG. 7 shows a block diagram of an electronic device suitable for use with the described embodiments.

FIG. 7 is a block diagram of an electronic device 700 suitable for use with the described embodiments. The electronic device 700 illustrates circuitry of a representative computing device. The electronic device 700 includes a processor 702 that pertains to a microprocessor or controller for controlling the overall operation of the electronic device 700. The electronic device 700 stores media data pertaining to media items in a file system 704 and a cache 706. The file system 704 is, typically, a storage disk or a plurality of disks. The file system 704 typically provides high capacity storage capability for the electronic device 700. However, since the access time to the file system 704 is relatively slow, the electronic device 700 can also include a cache 706. The cache 706 is, for example, Random-Access Memory (RAM) provided by semiconductor memory. The relative access time to the cache 706 is substantially shorter than for the file system 704. However, the cache 706 does not have the large storage capacity of the file system 704. Further, the file system 704, when active, consumes more power than does the cache 706. The power consumption is often a concern when the electronic device 700 is a portable media device that is powered by a battery 708. The electronic device 700 can also include RAM 710 and Read-Only Memory (ROM) 712. The ROM 712 can store programs, utilities or processes to be executed in a non-volatile manner. The RAM 710 provides volatile data storage, such as for the cache 706.

The electronic device 700 also includes a user input device 714 that allows a user of the electronic device 700 to interact with the electronic device 700. For example, the user input device 714 can take a variety of forms, such as a button, keypad, dial, touch screen, audio input interface, visual/image capture input interface, input in the form of sensor data, etc. Still further, the electronic device 700 includes a display 716 (screen display) that can be controlled by the processor 702 to display information to the user. A data bus 718 can facilitate data transfer between at least the file system 704, the cache 706, the processor 702, and the CODEC 720.

In one embodiment, the electronic device 700 serves to store a plurality of media items (e.g., songs, podcasts, etc.) in the file system 704. When a user desires to have the electronic device play a particular media item, a list of available media items is displayed on the display 716. Then, using the user input device 714, a user can select one of the available media items. The processor 702, upon receiving a selection of a particular media item, supplies the media data (e.g., audio file) for the particular media item to a coder/decoder (CODEC) 720. The CODEC 720 then produces analog output signals for a speaker 722. The speaker 722 can be a speaker internal to the electronic device 700 or external to the electronic device 700. For example, headphones or earphones that connect to the electronic device 700 would be considered an external speaker.

The electronic device 700 also includes a network/bus interface 724 that couples to a data link 726. The data link 726 allows the electronic device 700 to communicate with a host computer or to accessory devices. The data link 726 can be provided over a wired connection or a wireless connection. In the case of a wireless connection, the network/bus interface 724 can include a wireless transceiver. The media items (media assets) can pertain to one or more different types of media content. In one embodiment, the media items are audio tracks (e.g., songs, audio books, and podcasts). In another embodiment, the media items are images (e.g., photos). However, in other embodiments, the media items can be any combination of audio, graphical or visual content. Sensor 728 can take the form of circuitry for detecting any number of stimuli. For example, sensor 728 can include a Hall Effect sensor responsive to external magnetic field, an audio sensor, a light sensor such as a photometer, and so on.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a computer readable medium for controlling manufacturing operations or as computer readable code on a computer readable medium for controlling a manufacturing line. The computer readable medium is any data storage device that can store data that can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. An electronic device attachment system for attaching a releasable accessory device to an electronic device, comprising:
   a power source;
   a permanent magnet that produces a magnetic field that retains the accessory device to the electronic device;
   an electromagnet switchably coupled to the power source, the electromagnet having a magnetic force strength based on an amount of energy supplied by the power source; and
   a magnetic field sensor capable of detecting changes in the magnetic field, wherein when the magnetic field sensor detects a change in the magnetic field corresponding to a separation event, energy is provided from the power source to the electromagnet such that the electromagnet is activated to prevent separation of the electronic device and the accessory device.

2. The electronic device attachment system as recited in claim 1, further comprising:
   a housing enclosing the power source, the electromagnet and the magnetic field sensor.

3. The electronic device attachment system as recited in claim 1, wherein the magnetic field sensor is a first magnetic field sensor, the electromagnet is a first electromagnet and wherein the electronic device further comprises:
   a second electromagnet switchably coupled to the power source;
   a second magnetic field sensor that electrically couples the second electromagnet with the power source; and
   a comparator that determines a difference between the magnetic field changes detected by the first and second magnetic field sensors,
   wherein the comparator provides a signal that directs the first and second magnetic field sensors to independently activate the first and second electromagnets.

4. The electronic device attachment system as recited in claim 1, wherein the electromagnet includes switching circuitry configured to reverse a direction current flows through coils of the electromagnet.

5. The electronic device attachment system as recited in claim 1, further comprising a user interface,
   wherein a processor in communication with the user interface sends a signal directing release of the accessory device when a user input is received by the user interface requesting disconnection of the accessory device from the electronic device.

6. The electronic device attachment system as recited in claim 5, wherein the user interface comprises a touch sensitive display assembly and the power source comprises a battery.

7. The electronic device attachment system as recited in claim 1, wherein the accessory device is a protective cover that is magnetically coupled with the electronic device by way of the permanent magnet.

8. A portable electronic device, comprising:
   a power source;
   a number of electromagnet assemblies, each of the electromagnet assemblies comprising an electromagnet, a magnetic field sensor and a switch, the switch allowing electrical energy from the power source to energize the electromagnet when the magnetic field sensor detects a magnetic field falling within a predefined range of magnetic field characteristics; and
   a permanent magnet configured to secure a magnetically attractable device to an exterior surface of the portable electronic device.

9. The portable electronic device as recited in claim 8, further comprising:
   a comparator that compares magnetic field readings detected by each of the magnetic field sensors and adjusts the predefined range of magnetic field characteristics in accordance with the magnetic field readings.

10. The portable electronic device as recited in claim 9, further comprising a number of permanent magnets arranged in an alternating polarity pattern complementary to a polarity pattern formed by permanent magnets of the magnetically attractable device.

11. The portable electronic device as recited in claim 9, wherein the comparator adjusts the predefined range of magnetic field characteristics so that a first one of the electromagnets is energized before a second one of the electromagnets.

12. The portable electronic device as recited in claim 11, wherein a sequential energizing of the electromagnets is performed at an interval that causes mating surfaces of the portable electronic device and the magnetically attractable device to be aligned when the mating surface of the portable electronic device and the magnetically attractable device first come into contact.

13. The portable electronic device as recited in claim 12, wherein the magnetically attractable device is the same as the portable electronic device.

14. The portable electronic device as recited in claim 8, wherein the electromagnet comprises two sets of coils arranged about opposing ends of a substantially u-shaped magnetically attractable material, the electromagnet emitting adjacent opposite polarity fields.

15. The portable electronic device as recited in claim 8, further comprising a processor configured to direct a flow of energy through at least one of the electromagnets to be reversed.

16. A portable computing device, comprising:
a housing formed of a magnetically neutral material;
a display assembly disposed within the housing;
a battery; and
a number of electromagnet assemblies disposed within the housing, each of the electromagnet assemblies comprising an analog switching mechanism that supplies power to an electromagnet from the battery when a sensing coil detects a changing magnetic field meeting a predefined magnetic field characteristic.

17. The portable computing device as recited in claim 16, wherein the analog switching mechanism comprises a field effect transistor switch.

18. The portable computing device as recited in claim 17, wherein the field effect transistor switch comprises a band pass filter that determines whether the predefined magnetic field characteristic is met and limits a duty cycle of the electromagnet.

* * * * *